(12) United States Patent
    Saideh

(10) Patent No.: US 9,276,539 B2
(45) Date of Patent: *Mar. 1, 2016

(54) POWER TRANSFERRING HEADPHONES

(71) Applicant: Zeikos Inc., New York, NY (US)

(72) Inventor: Isaac Saideh, Edison, NJ (US)

(73) Assignee: Zeikos Inc., Edison, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/533,718

(22) Filed: Nov. 5, 2014

(65) Prior Publication Data

US 2015/0124993 A1     May 7, 2015

Related U.S. Application Data

(63) Continuation-in-part of application No. 14/071,223, filed on Nov. 4, 2013, now Pat. No. 8,923,525, which is a continuation of application No. 13/760,765, filed on Feb. 6, 2013, now abandoned, application No.

(Continued)

(51) Int. Cl.
    *H04R 1/10*      (2006.01)
    *H03G 3/00*      (2006.01)
    *H04R 5/033*     (2006.01)

(52) U.S. Cl.
    CPC ............... *H03G 3/00* (2013.01); *H04R 1/1033* (2013.01); *H04R 1/1041* (2013.01); *H04R 1/1066* (2013.01); *H04R 5/033* (2013.01); *H04R 2420/07* (2013.01); *H04R 2420/09* (2013.01); *H04R 2460/03* (2013.01)

(58) Field of Classification Search
    CPC ............... H04R 1/1033; H04R 1/1041; H04R 2460/03; H04R 2420/09; H04R 5/033; H04R 2420/07; H04R 1/1066; H03G 3/00

USPC .................................................. 381/74, 309
See application file for complete search history.

(56) References Cited

U.S. PATENT DOCUMENTS 2,622,159 A    12/1952  Herman
D187,362 S      3/1960  Ellefson
               (Continued)

FOREIGN PATENT DOCUMENTS

GB        2418546     3/2006
WO        9819223     5/1998
               (Continued)

OTHER PUBLICATIONS

JJR Acoustics, LLC, "Headphones," Product Design Specification, Version 1.3, Oct. 11, 2012.

(Continued)

*Primary Examiner* — Paul S Kim
(74) *Attorney, Agent, or Firm* — Amster, Rothstein & Ebenstein, LLP

(57) ABSTRACT

The invention relates to headphones which can facilitate the transfer of electrical power from the headphones' internal power source to other devices. A pair of headphones can connect to a device through a modified cable. The modified cable triggers the transfer of electrical power to the device. A pair headphones may have a modified port which, when connected to the device through a non-modified or regular cable, causes the transfer of power from the headphones. A power management component connected to the internal power source of the headphones helps control or regulate the transfer of power transfer to and from the headphones.

18 Claims, 18 Drawing Sheets

Related U.S. Application Data

14/533,718, which is a continuation-in-part of application No. 29/483,095, filed on Feb. 25, 2014, which is a continuation of application No. 29/473,402, filed on Nov. 21, 2013, now Pat. No. Des. 722,996.

(56) References Cited

U.S. PATENT DOCUMENTS

| | | |
|---|---|---|
| 4,529,058 A | 7/1985 | Emery |
| 5,068,923 A | 12/1991 | Sjoqvist |
| 5,164,652 A | 11/1992 | Johnson et al. |
| 5,254,931 A | 10/1993 | Martensson |
| 5,333,177 A | 7/1994 | Braitberg et al. |
| 5,350,993 A | 9/1994 | Toya et al. |
| 5,369,352 A | 11/1994 | Toepfer et al. |
| 5,420,496 A | 5/1995 | Ishikawa |
| 5,506,490 A | 4/1996 | DeMuro |
| 5,534,765 A | 7/1996 | Kreisinger et al. |
| 5,570,002 A | 10/1996 | Castleman |
| 5,573,425 A | 11/1996 | Morisawa et al. |
| 5,593,323 A | 1/1997 | Dernehl |
| 5,615,344 A | 3/1997 | Corder |
| 5,694,024 A | 12/1997 | Dias et al. |
| 5,703,467 A | 12/1997 | Patino |
| 5,783,926 A | 7/1998 | Moon et al. |
| 5,836,783 A | 11/1998 | Morisawa et al. |
| 5,861,729 A | 1/1999 | Maeda et al. |
| 5,870,615 A | 2/1999 | Bar-On et al. |
| 5,912,544 A | 6/1999 | Miyakawa et al. |
| 5,939,856 A | 8/1999 | Demuro et al. |
| 5,955,797 A | 9/1999 | Kim |
| 5,969,438 A | 10/1999 | Odaohara |
| 6,054,846 A | 4/2000 | Castleman |
| 6,184,652 B1 | 2/2001 | Yang |
| 6,288,522 B1 | 9/2001 | Odaohhara et al. |
| 6,358,096 B1 | 3/2002 | Beckman |
| 6,360,177 B1 | 3/2002 | Curt et al. |
| 6,368,155 B1 | 4/2002 | Bassler et al. |
| 6,459,175 B1 | 10/2002 | Potega |
| 6,528,970 B1 | 3/2003 | Liu et al. |
| 6,597,565 B1 | 7/2003 | Kluth et al. |
| 6,628,535 B1 | 9/2003 | Wu |
| 6,751,109 B2 | 6/2004 | Doss et al. |
| 6,795,302 B2 | 9/2004 | Kluth et al. |
| 6,903,950 B2 | 6/2005 | Afzal et al. |
| 6,928,310 B2 | 8/2005 | Lee |
| 6,999,505 B2 | 2/2006 | Yokoo et al. |
| RE39,036 E | 3/2006 | Castleman |
| 7,028,202 B2 | 4/2006 | Long et al. |
| 7,039,821 B1 | 5/2006 | Potega |
| 7,127,623 B2 | 10/2006 | Potega |
| 7,145,312 B2 | 12/2006 | Lanni |
| 7,158,815 B2 | 1/2007 | Roh |
| 7,392,099 B2 | 6/2008 | Atkinson et al. |
| 7,392,410 B2 | 6/2008 | Allen et al. |
| 7,453,171 B2 | 11/2008 | Lanni |
| 7,541,776 B2 | 6/2009 | Tupman et al. |
| 7,548,040 B2 | 6/2009 | Lee et al. |
| 7,868,486 B2 | 1/2011 | Lanni |
| 7,937,603 B2 | 5/2011 | Haberle et al. |
| 7,999,412 B2 | 8/2011 | Lanni |
| 8,019,096 B2 | 9/2011 | Sander et al. |
| 8,086,281 B2 | 12/2011 | Rabu et al. |
| 8,090,132 B2 | 1/2012 | Tang et al. |
| 8,155,367 B2 | 4/2012 | Singh |
| 8,214,545 B2 | 7/2012 | Khan et al. |
| 8,269,453 B2 | 9/2012 | Ludtke |
| 8,295,532 B2 | 10/2012 | Hsu et al. |
| 8,330,303 B2 | 12/2012 | Lanni |
| 8,492,933 B2 | 7/2013 | Lanni |
| 8,923,525 B2 * | 12/2014 | Saideh ................. H04R 1/1033 381/309 |
| 2002/0147036 A1 | 10/2002 | Taguchi et al. |
| 2002/0171980 A1 | 11/2002 | Tsukihashi |
| 2003/0157974 A1 | 8/2003 | Lin |
| 2003/0207603 A1 | 11/2003 | Potega |
| 2003/0222503 A1 | 12/2003 | Lam et al. |
| 2004/0012368 A1 | 1/2004 | Massey et al. |
| 2004/0075419 A1 | 4/2004 | Massey et al. |
| 2004/0217733 A1 | 11/2004 | Liu et al. |
| 2005/0024030 A1 | 2/2005 | Lanni |
| 2005/0127758 A1 | 6/2005 | Atkinson et al. |
| 2005/0151511 A1 | 7/2005 | Chary |
| 2005/0162020 A1 | 7/2005 | Lanni |
| 2005/0280398 A1 | 12/2005 | Lee et al. |
| 2006/0164061 A1 | 7/2006 | Formenti et al. |
| 2006/0220465 A1 | 10/2006 | Kingsmore et al. |
| 2007/0072649 A1 | 3/2007 | Park |
| 2007/0278999 A1 | 12/2007 | Hsia |
| 2008/0125164 A1 | 5/2008 | Singh |
| 2008/0180874 A1 | 7/2008 | Gauger et al. |
| 2008/0307565 A1 | 12/2008 | Le Gette et al. |
| 2009/0011793 A1 | 1/2009 | Pocrass |
| 2009/0023480 A1 | 1/2009 | Nandi et al. |
| 2009/0180642 A1 | 7/2009 | Sander et al. |
| 2009/0323975 A1 * | 12/2009 | Groesch ................. H04R 5/033 381/71.1 |
| 2010/0298029 A1 | 11/2010 | Jang |
| 2011/0145445 A1 | 6/2011 | Malamant et al. |
| 2011/0170702 A1 | 7/2011 | Bays |
| 2011/0286615 A1 | 11/2011 | Olodort et al. |
| 2011/0311071 A1 | 12/2011 | Gauger, Jr. et al. |
| 2012/0039481 A1 | 2/2012 | McClain |
| 2012/0062169 A1 | 3/2012 | Reymann |
| 2012/0224710 A1 | 9/2012 | Terlizzi et al. |
| 2013/0320913 A1 | 12/2013 | Chen |
| 2015/0124993 A1 * | 5/2015 | Saideh ................. H04R 1/1033 381/74 |

FOREIGN PATENT DOCUMENTS

| | | |
|---|---|---|
| WO | 2006116298 | 11/2006 |
| WO | 2011150381 | 12/2011 |

OTHER PUBLICATIONS

Linear Technology Corporation, "Applications Information," LTC4160/LTC4160-1, 2009; http://cds.linear.com/docs/Datasheet/41601fa.pdf.

Wata Electronics Co., Ltd., Design Model Chart, Oct. 11, 2012.

U.S. Appl. No. 13/760,765, filed on Feb. 6, 2013.

Compaq Computer Corporation, et al. "Universal Serial Bus Specification" Revision 2.0, Apr. 27, 2000.

Kickstarter, "Jump—The First Charging Solution That Fits Your Lifestyle," available at http://www.kickstarter.com/projects/nativeunion/jump-the-first-charging-solution-that-fits-yourli (last accessed Jan. 9, 2014).

International Search Report for PCT Patent Application No. PCT/US2014/015108, filing date Feb. 6, 2014, mailed on May 27, 2014.

* cited by examiner

POWER TRANSFERRING HEADPHONES

CROSS-REFERENCE TO RELATED APPLICATION

This application is a Continuation-in-Part of U.S. patent application Ser. No. 14/071,223, filed on Nov. 4, 2013, which is a Continuation of U.S. patent application Ser. No. 13/760,765, filed on Feb. 6, 2013, the entire contents of each of which are incorporated by reference herein. This application is also a Continuation-In-Part of U.S. Design patent application Ser. No. 29/483,095, filed on Feb. 25, 2014, which is a Continuation of U.S. Design patent application Ser. No. 29/473,402, filed on Nov. 21, 2013, the entire contents of each of which are incorporated by reference herein.

FIELD

The present disclosure generally relates to headphones which can transfer electrical power from the headphones to an external device.

SUMMARY

The present disclosure generally relates to headphones which can transfer electrical power from the headphones to an external device.

In an exemplary embodiment, a headphone device is disclosed that comprises a first speaker unit for providing audio output, a second speaker unit for providing audio output, an internal power source, one or more powered components electrically coupled with the internal power source, a port, and an internal power management component. The second speaker unit is connected to the first speaker unit with a band. The internal power source is disposed in an interior portion of the headphone device, and the one or more powered components are electrically coupled with the internal power source to receive electrical power from the internal power source. The port is located on one of the first speaker unit and the second speaker unit, and is in electrical communication with the internal power source. The internal power management component is connected between the internal power source and the port, and is configured to cause electrical power to flow from the internal power source through the port.

In embodiments, the one or more powered components comprise a wireless communication receiver.

In embodiments, the one or more powered components comprise an amplifier.

In embodiments, the internal power management component is configured to control an output voltage of the internal power source.

In embodiments, the port is configured to receive a first end of an electrical cable with a second end connectable to an external device.

In embodiments, the port is configured to receive a first end of an electrical cable with a second end connectable to a power adaptor for providing power from a wall outlet to charge the internal power source.

In embodiments, a data pin of the first end of the electrical cable is electrically grounded.

In embodiments, the electrical cable further comprises a removable adaptor at the first end of the electrical cable for electrically grounding a data pin of the electrical cable.

In embodiments, the power management component is configured to determine the amount of electrical power in the internal power source and prevents the transfer of electrical power from the internal power source if the amount of electrical power is less than or equal to a predefined threshold electrical power level.

In embodiments, the internal power source comprises one or more rechargeable batteries.

In embodiments, the internal power source comprises one or more disposable batteries.

In embodiments, the power management component comprises a power manager integrated circuit.

In embodiments, the port is a USB-type port for receiving a USB-type cable.

In embodiments, the USB type port is a micro USB port and the USB-type cable has at least one micro USB-type connector.

In embodiments, the one or more powered components comprise a wireless communication transmitter.

In embodiments, the one or more powered components comprise a wireless communication transceiver.

In embodiments, the one or more powered components comprise an amplifier.

In embodiments, the amplifier continuously receives electrical power from the internal power source.

In embodiments, the amplifier is configured to apply a voltage gain to an input electrical signal along a frequency range of 20 Hz to 20,000 Hz.

In embodiments, the amplifier is configured to apply a voltage gain along a frequency range of 20 Hz to 500 Hz.

In an exemplary embodiment, a pair of headphones may include a left speaker unit including a left speaker for providing audio output; a right speaker unit including a right speaker for providing audio output; an adjustable band configured to hold the left speaker unit and the right speaker unit; a port located on one of the speaker units, the port operatively connected to an internal power source of the headphones; and a power management component for regulating the internal power source of the headphones so that when a first cable is connected to the port and to an external device electrical power is transferred to the external device, and when a power adaptor is connected to the port and to a wall outlet, the internal power source is being charged.

In some exemplary embodiments, the data pin of the connecting end of the first cable may be electrically grounded.

In some exemplary embodiments, the first cable may also include a removable adaptor at the end of the first cable connecting to the port, the connector electrically grounding a data pin of the first cable.

In some exemplary embodiments, the power management component of the headphones may determines the amount of power in the internal power source and prevents the transfer of power from the internal power source if the amount of power is less than or equal to a predefined threshold power level.

In some exemplary embodiments, the integral power source may be one or more rechargeable batteries.

In some exemplary embodiments, the power management component may be a power manager integrated circuit. For example, the integrated circuit may be a Linear Chip LTC4160.

In some exemplary embodiments, port may be a USB type port and the first cable may be a USB type cable. For example, the USB port may be a micro USB port and the USB type cable can have at least one micro USB type connector.

In some exemplary embodiments, the power adaptor may include a removable cable.

In exemplary embodiments, a pair of headphones may include a left speaker unit including a left speaker for providing audio output; a right speaker unit including a right speaker for providing audio output; an adjustable band configured to hold the left speaker unit and the right speaker unit; a first port located on one of the speaker units, the first port electrically connected to an internal power source of the headphones; a second port located one of the speaker unit, the second port electrically connected to the internal power source of the headphones; and a power management component for regulating the internal power source of the headphones so that when a first cable is connected to the first port and to an external device electrical power is transferred to the external device, and when a power adaptor is connected to the second port and to a wall outlet, the internal power source is being charged.

In some exemplary embodiments, one of the ports may be a USB port and the other port may be a micro USB port.

DESCRIPTION OF THE DRAWINGS

The features and advantages of the present disclosure will be more fully understood with reference to the following, detailed description when taken in conjunction with the accompanying figures, wherein.

DETAILED DESCRIPTION

Figure 1A:
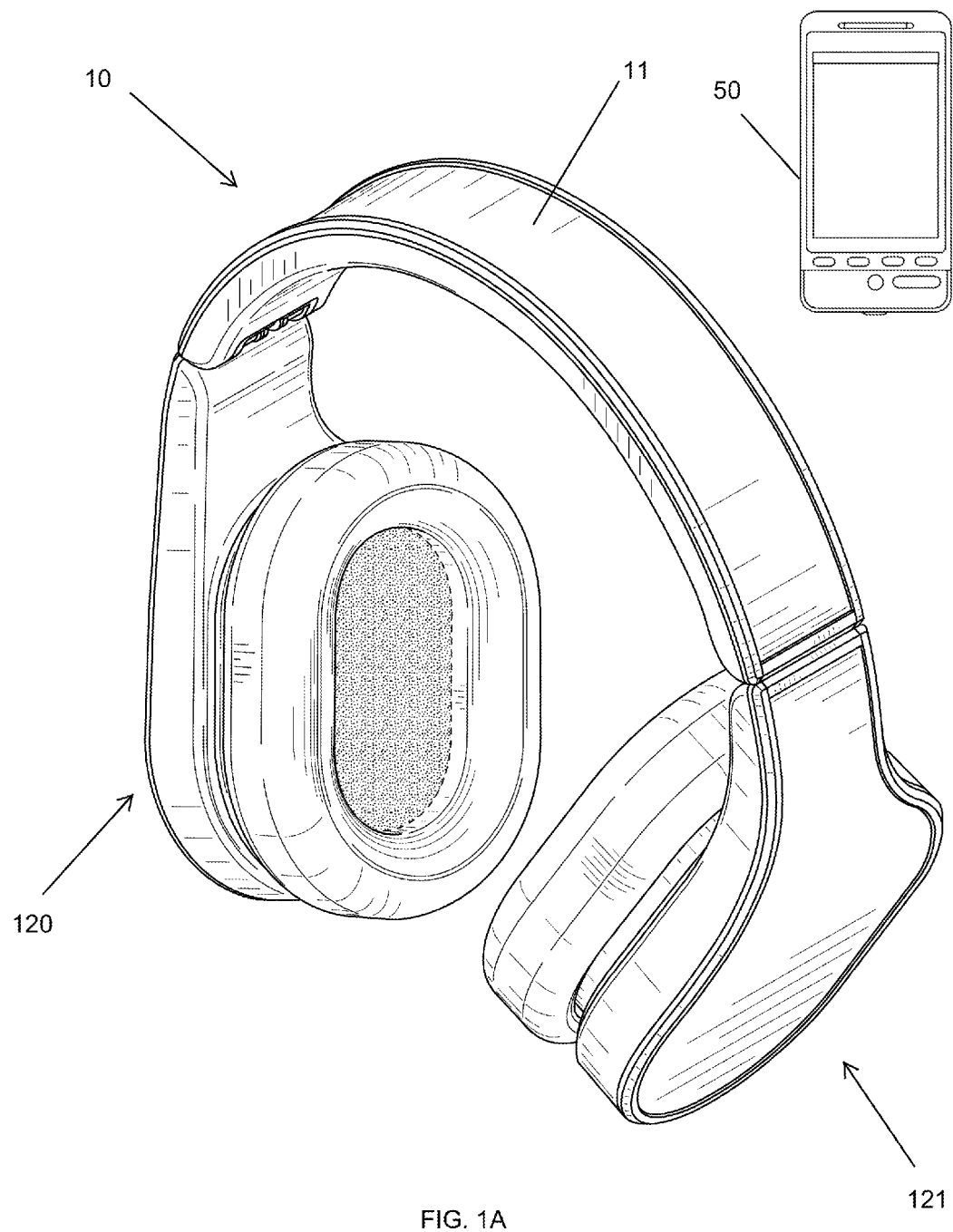
FIG. 1A is a perspective view of a pair of headphones with an associated external device according to an exemplary embodiment of the present invention.
Figure 1B:
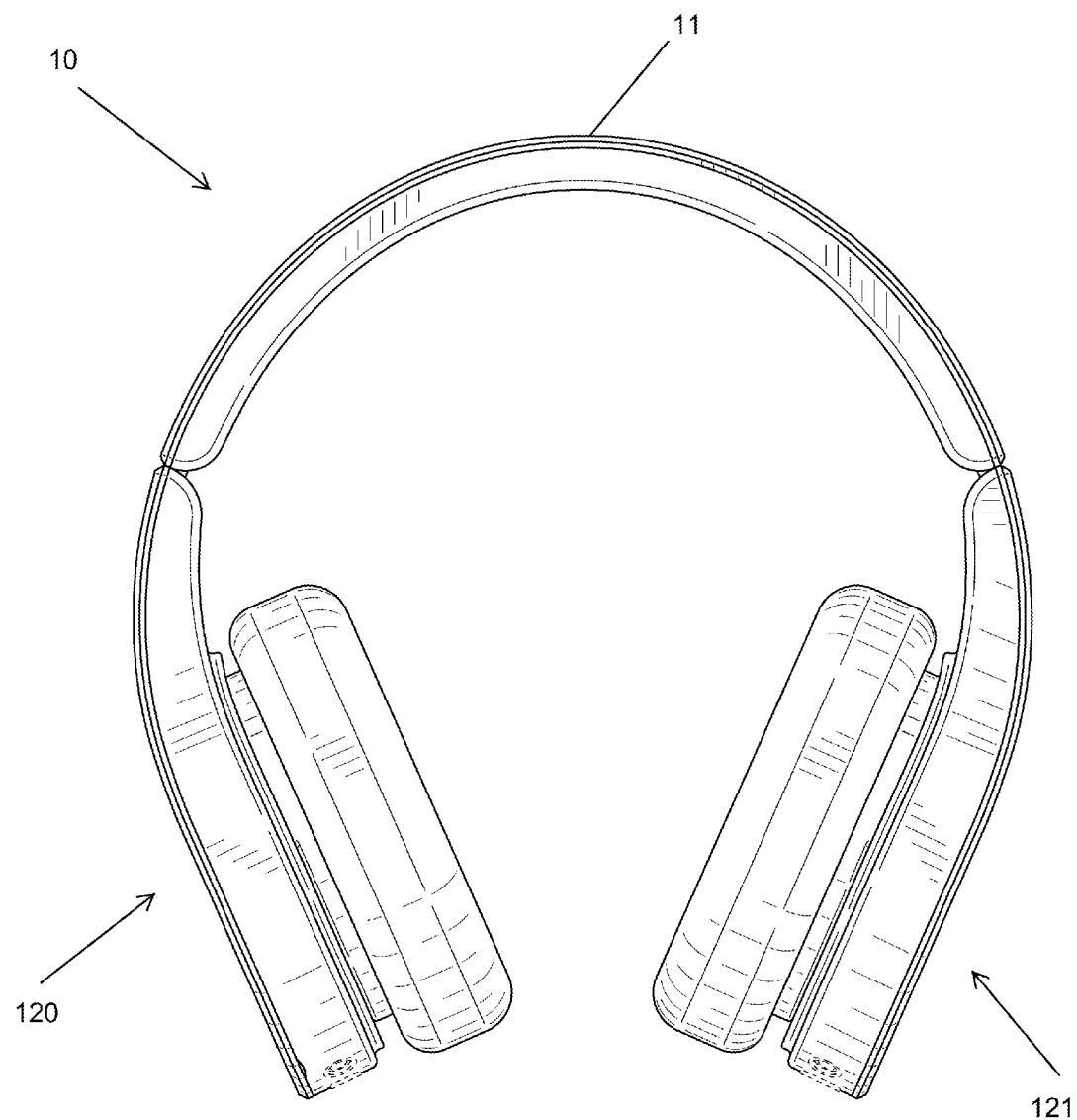
FIG. 1B is a front view of the headphones of FIG. 1A.
Figure 1C:
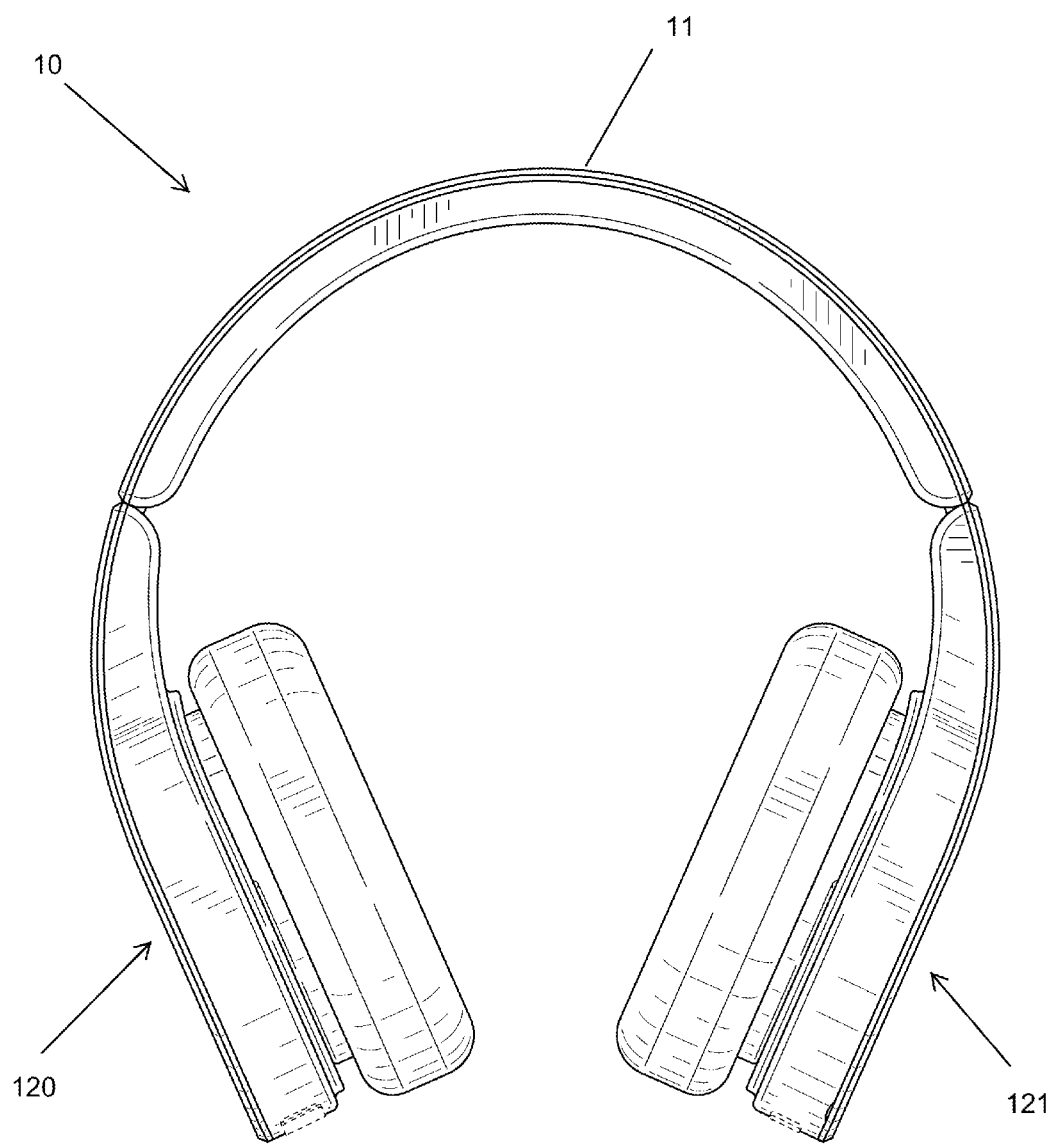
FIG. 1C is a rear view of the headphones of FIG. 1A.
Figure 1D:
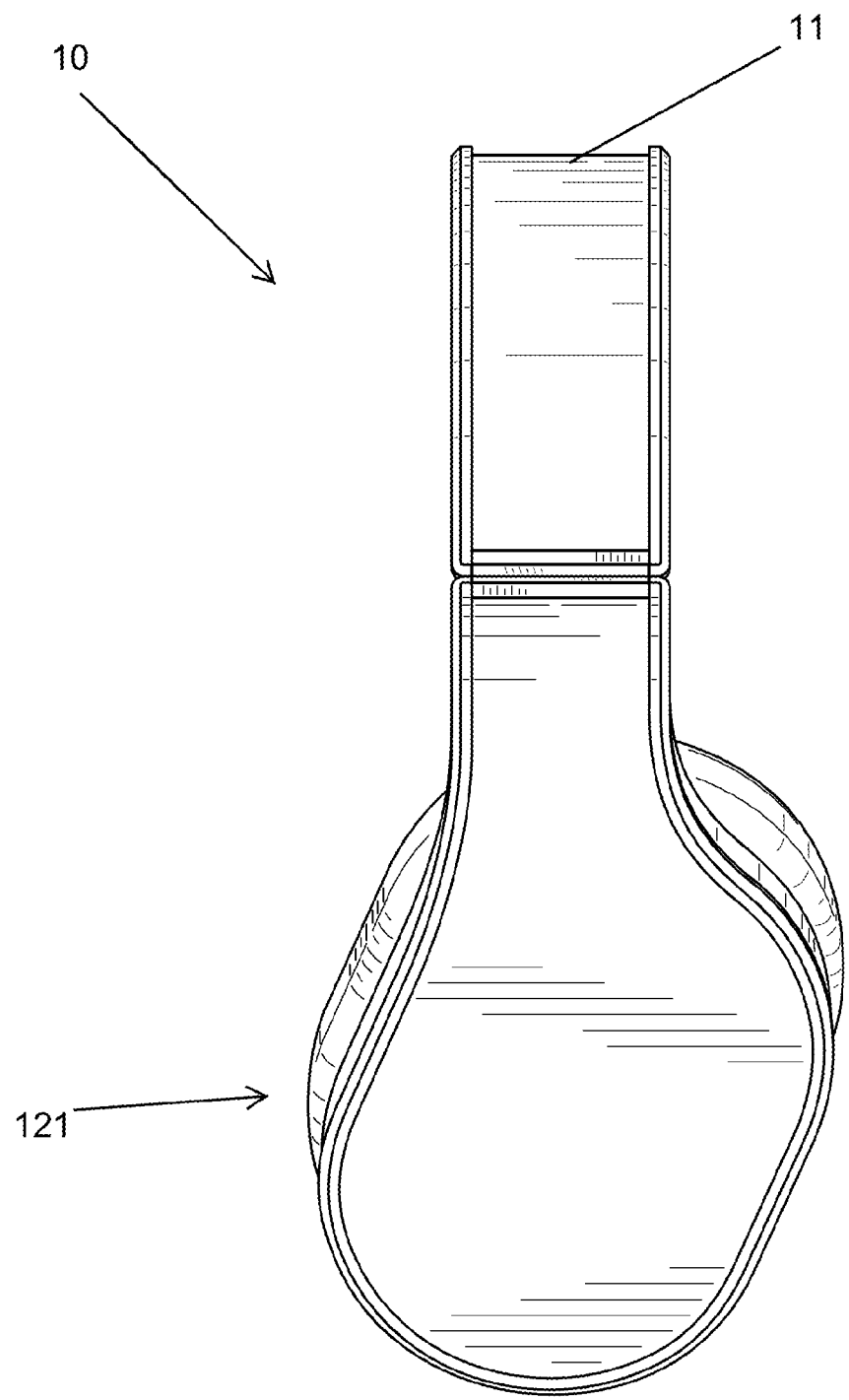
FIG. 1D is a side view of the headphones of FIG. 1A.
Figure 1E:
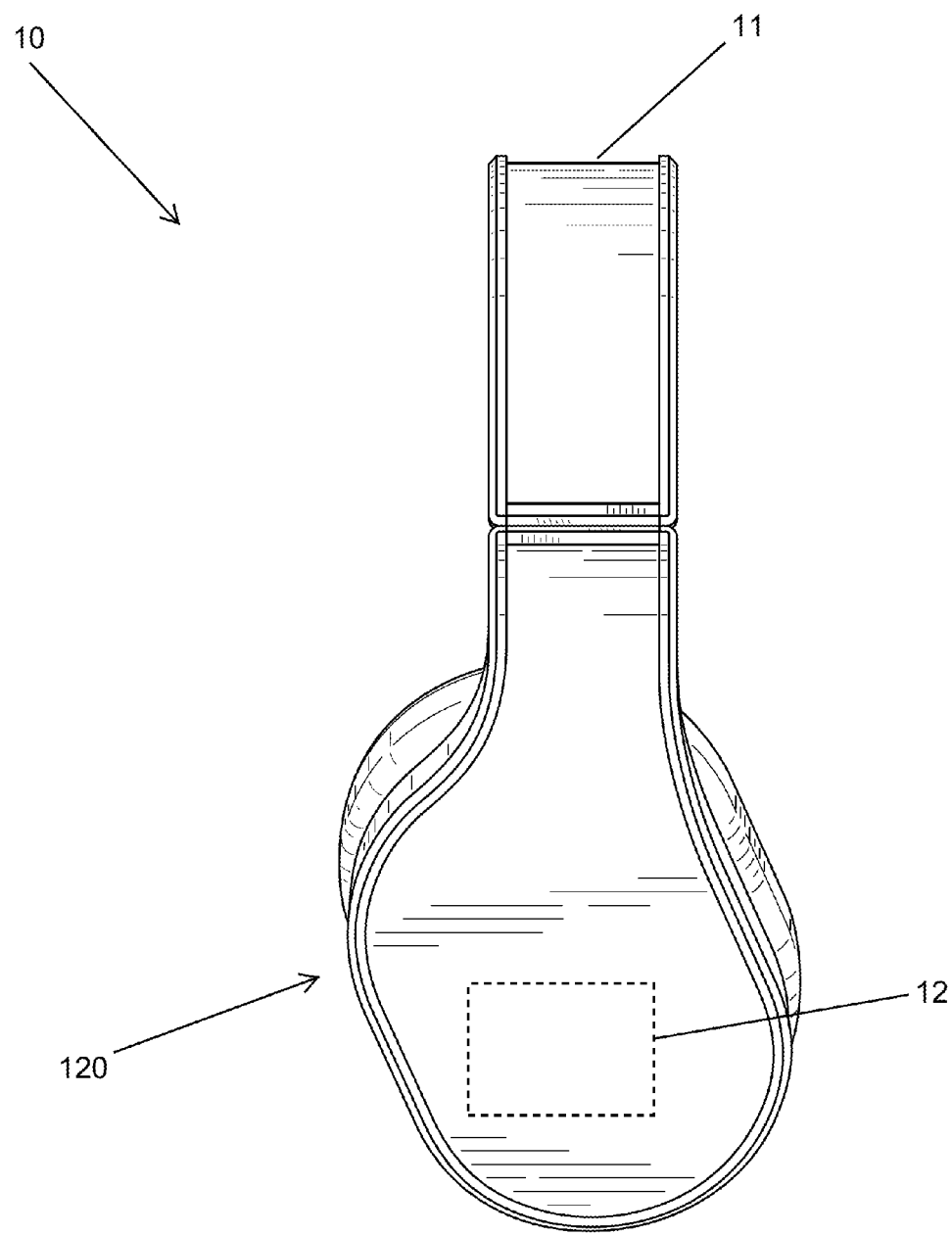
FIG. 1E is a side view of the headphones of FIG. 1A opposite the side view shown in FIG. 1D.
Figure 1F:
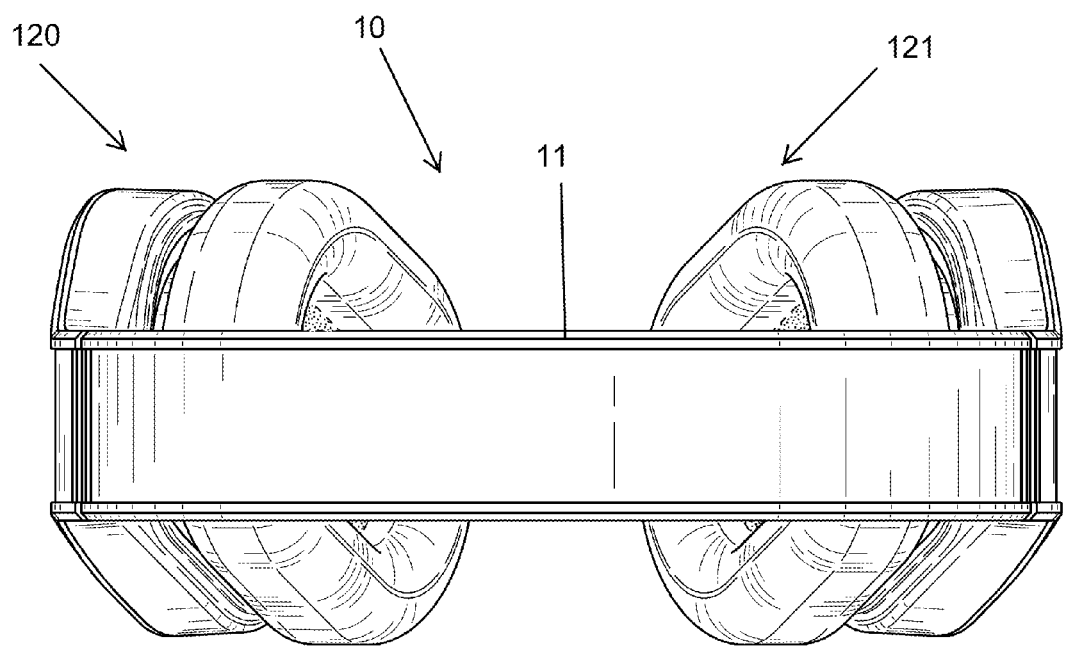
FIG. 1F is a top plan view of the headphones of FIG. 1A.
Figure 1G:
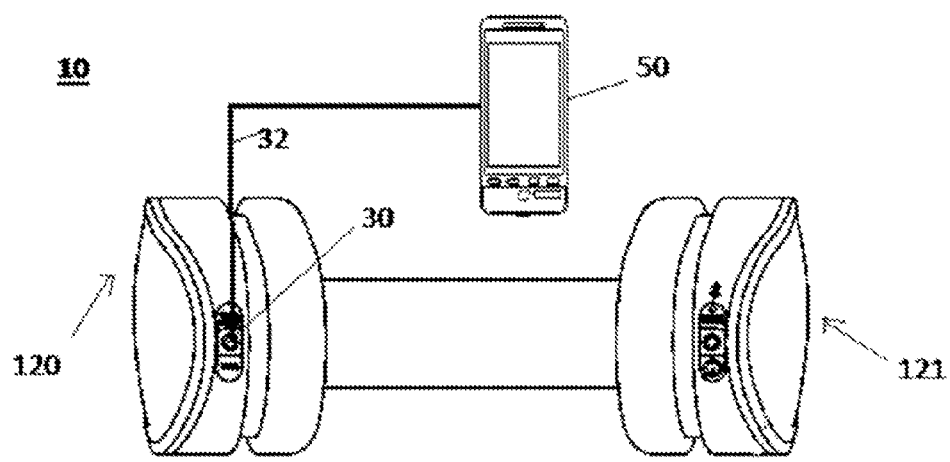
FIG. 1G is a bottom plan view of the headphones of FIG. 1A shown connected to the external device.

The present invention generally relates to audio headphones and associated methods of configuration and use for transferring electrical power from a pair of headphones to a connected external device. The drawing figures are not necessarily drawn to scale and certain figures may be shown in exaggerated or generalized form in the interest of clarity and conciseness.

Referring to FIGS. 1A-1G, a pair of headphones 10 are shown according to an exemplary embodiment of the present invention. Headphones 10 are adapted for connection to an external device 50, as described further below.

Headphones 10, as shown, include a first speaker 120 and a second speaker 121 attached with a band 11. Each of the speakers 120 and 121 are configured to provide audio output, e.g., audible sounds, to a user of the headphones 10. Typically, a user wears the pair of headphones 10 about a portion of his or her head, for example, with the band overlying a top and/or back portion of his or her head so that each of the speakers 120 and 121 rests on or near a respective ear of the user.

Accordingly, the pair of headphones 10 may include a variety of configurations to facilitate the comfort or accessibility for a user, for example, padded and/or ergonomically curved sections. In embodiments, the band 11 may be adjustable, e.g., through a sliding or interlocking mechanism, so that the relative spacing of speakers 120 and 121 can be adjusted to accommodate users having differently-sized body portions.

Headphones 10 may incorporate a number of features to facilitate the transmission of data and/or electrical power throughout headphones 10 and/or external device 50. Accordingly, headphones 10 may include an internal power source 12 (shown best in FIG. 1D) for supplying electrical power for one or more functions of headphones 10 and/or external device 50. Headphones 10 may also include a port 30 (shown best in FIG. 1G) for facilitating the connection with the external device 50, for example, with an electrical cable 32.

Figure 1H:
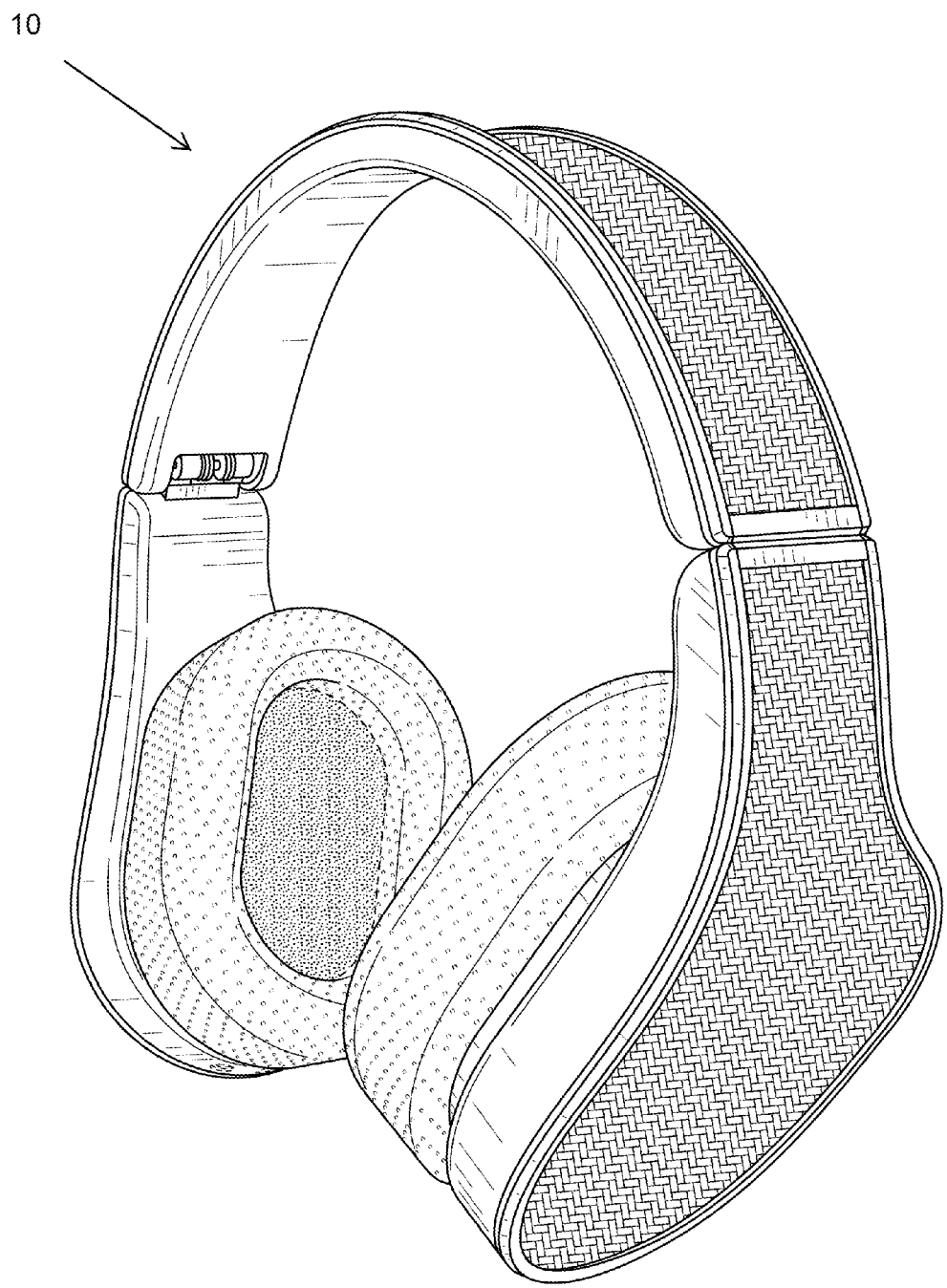
FIG. 1H is a perspective view of the headphones of FIG. 1A according to an alternative embodiment of the present invention.

Turning momentarily to FIG. 1H, an alternative embodiment of headphones 10 is illustrated. It will be understood that headphones 10 may have a variety of configurations in accordance with their intended use. For example, headphones 10 may incorporate internal or exterior features such as moisture-resistant materials or scratch-resistant materials.

Referring to FIG. 2I a schematic diagram of the pair of headphones 10 connected to external device 50 is shown according to an exemplary embodiment of the present invention. Internal power source 12 is disposed in an interior portion of headphones 10 for powering on-board features or functionalities of the headphones 10 in addition to or alternative to powering an externally-connected device. The internal power source 12 can be one or more batteries, which can be disposable or rechargeable, for example, lithium ion (Li-ion) or nickel cadmium (NiCad)-type power cells or disposable alkaline batteries. In embodiments, the headphones 10 may also include other powered features or functionalities, including, for example, amplifiers, a Bluetooth transmitter and/or receiver, noise cancellation circuitry, and/or a power management device, to name a few. The headphones 10, are illustrated as being full size, e.g., banded, over-the-ear-type headphones with a pair of speaker units, but any other electrically powered headphone device including at least one speaker unit adapted to be worn on a head portion of a user may be used herein, for example, earbud-type or wraparound-type headphones.

Figure 2:
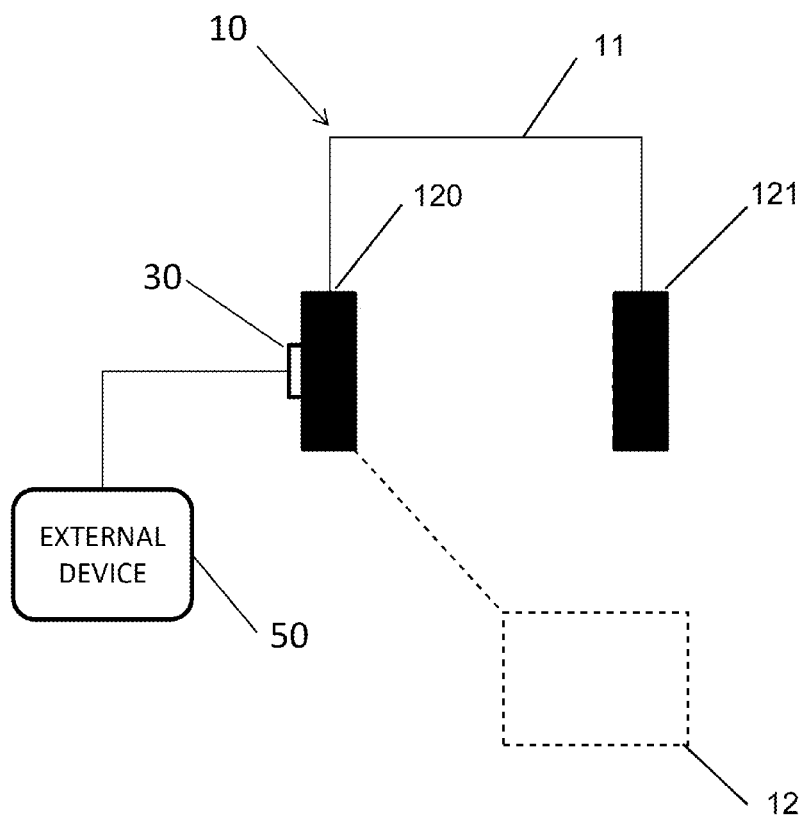
FIG. 2 is a schematic diagram of the pair of headphones of FIG. 1A connected with the external device.

With continued reference to FIG. 2, the headphones 10 connect to an external device 50 via communication port 30 in accordance with exemplary embodiments. The external device may be any device, for example mobile phones, smartphones (e.g., iPhone®, Android® devices, Blackberry® devices, Windows, etc.), tablets devices (e.g., iPad®, iPad®

Mini, Android® tablet, Surface', Chromebook, etc.), laptops, desktops, portable music players (e.g., iPod, iPodTouch, etc.), to name a few. It will be understood that other suitable types of external electronic devices can be used with the headphones described herein.

In embodiments, the headphones 10 can communicate data, and/or exchange electrical power via the port 30. As shown, the port 30 is integrated with one of speakers 120a, 120b. In embodiments, the port 30 can be located in any suitable location on a pair of headphones.

Figure 3:
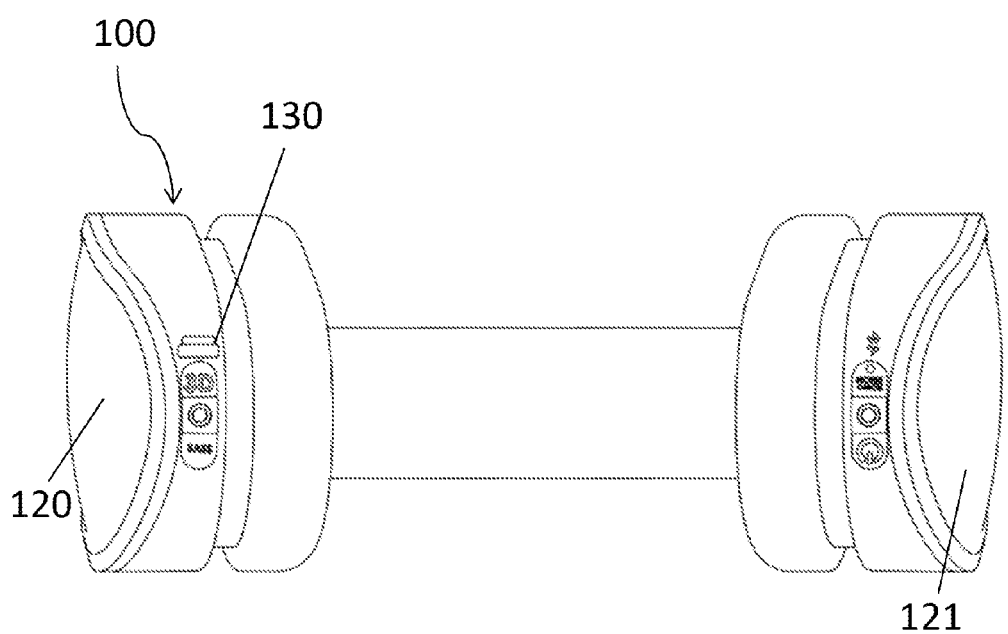
FIG. 3 illustrates a pair of headphones according to an exemplary embodiment of the present invention.

FIG. 3 illustrates, according to an exemplary embodiment, a pair of headphones 100 include a micro USB port 130 which can be used to charge the headphones (using a standard charge cable) and to charge other external devices. In this regard, the port 130 is integrated in one of the speakers 120. In embodiments, the port 130 can be electrically directly or indirectly connected to an internal power source of headphones 100. In exemplary embodiments, other ports can be used in lieu of a micro USB port or other USB port as discussed herein.

In exemplary embodiments, the flow of electrical power from the headphones 100 to an external device is facilitated or accomplished through the use of a specialized or modified cable. FIG. 3, shows, according to an exemplary embodiment, a modified USB cable 200. The cable 200 has a connector 210 for connecting to the headphones and an external connector 220 for connecting to an external device. In some embodiments, the connectors 210, 220 may be a micro USB type connector (because the headphones have a micro USB port), but cables with other types of connectors may be used in accordance with the embodiments described herein. In embodiments, the cable 200 may be modified such that at least one data pin of the connector is grounded. Other modifications can be made to the cable to enable a power management component (as discussed below) to distinguish between a charging cable and a discharging cable. The connection of cable to the headphones and to an external device causes electrical power to be transferred from the headphones to the electrical device.

Figure 4:
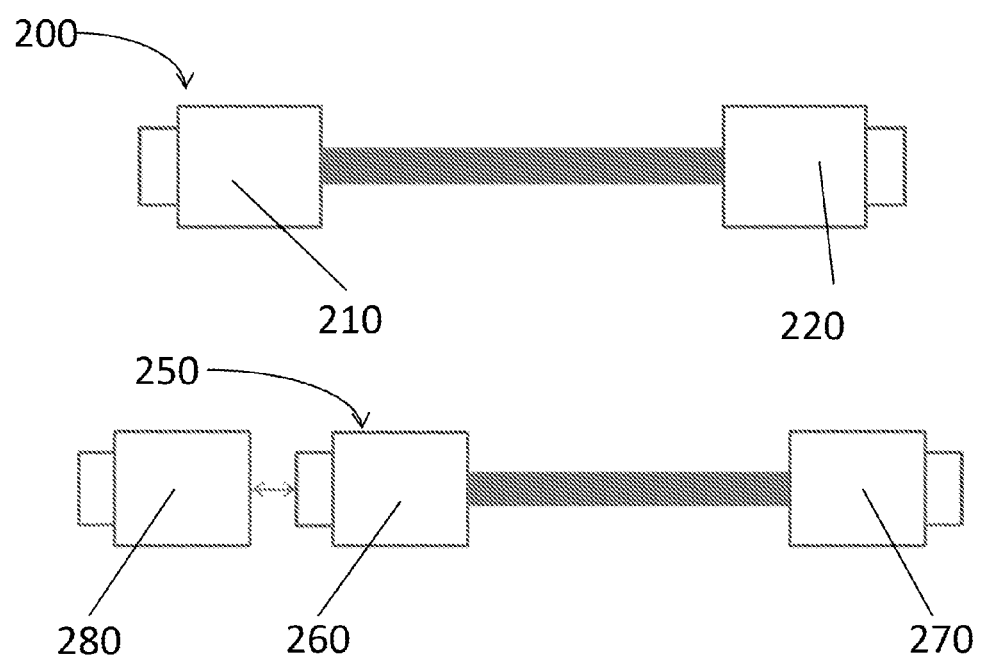
FIG. 4 illustrates cables used for transferring power according to an exemplary embodiment of the present invention.

In some exemplary embodiments, instead of using a modified USB cable to facilitate the transfer of power to an external device, a regular cable, (e.g., a standard USB type cable and the like) with an adaptor can be used. For example, referring to FIG. 4, a standard USB type cable 250 with regular male USB connectors 260, 270 may connect to the headphones via the adaptor 280. For example, the adaptor 280 has a male USB connector and can receive or attach to another male USB connector, such as connector 260.

In embodiments, the wires or connectors of the adaptor 280 can be modified or wired in order to effectively ground the data pin of the cable 250, in order to cause the headphones to provide electrical power to the USB device. Thus, in order to transfer power from the headphones, the adaptor 280 can be arranged to connect to the USB port 130 of the headphones at one end and connect to one of the connectors 260, 270 of the cable 250 at the other end. The connector of the cable not attached to the adaptor 280 connects to the external device. Other modifications can be made to the adaptor to enable the power management component (as discussed below) to distinguish between a charging operation and a discharging operation.

Figure 5:
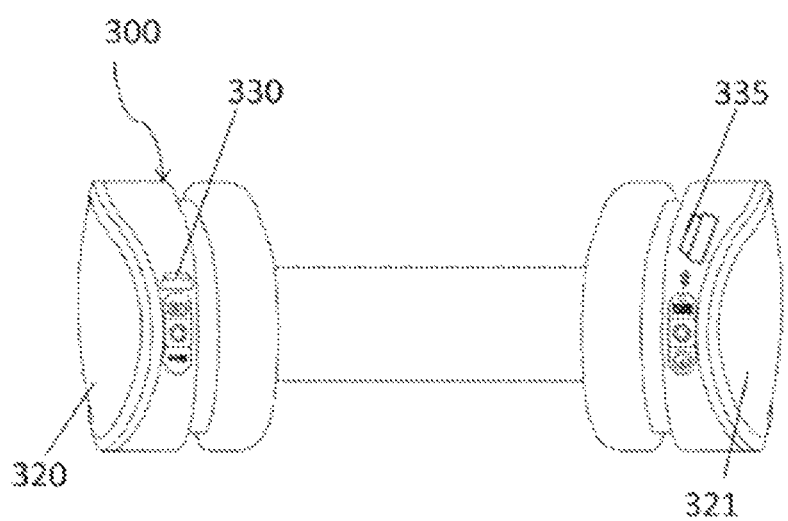
FIG. 5 illustrates a pair of headphones according to an exemplary embodiment of the present invention.

In exemplary embodiments, in order facilitate power from headphones to an external device, the headphones may include a modified port. For example, referring to FIG. 5, the headphones 300 have a micro USB port 330 built into speaker 320 and a regular USB port 335 built into speaker 321. The ports 330, 335 do not necessarily have to be incorporated on separate speaker units, such as speakers 320 and 321. Further, at least one of the ports 330, 335 can be modified so as to effectively modify a data pin of a connecting cable. Other modifications can be made to the ports to enable a power management component (as discussed below) to distinguish between a charging port and a discharging port. Therefore when a cable connects to the modified port and to an external device, electrical power transfers from the headphones to the external device. The unmodified port can be used in accordance with other functions of the headphones, e.g., to charge the headphones, update firmware, etc.

Figure 6A:
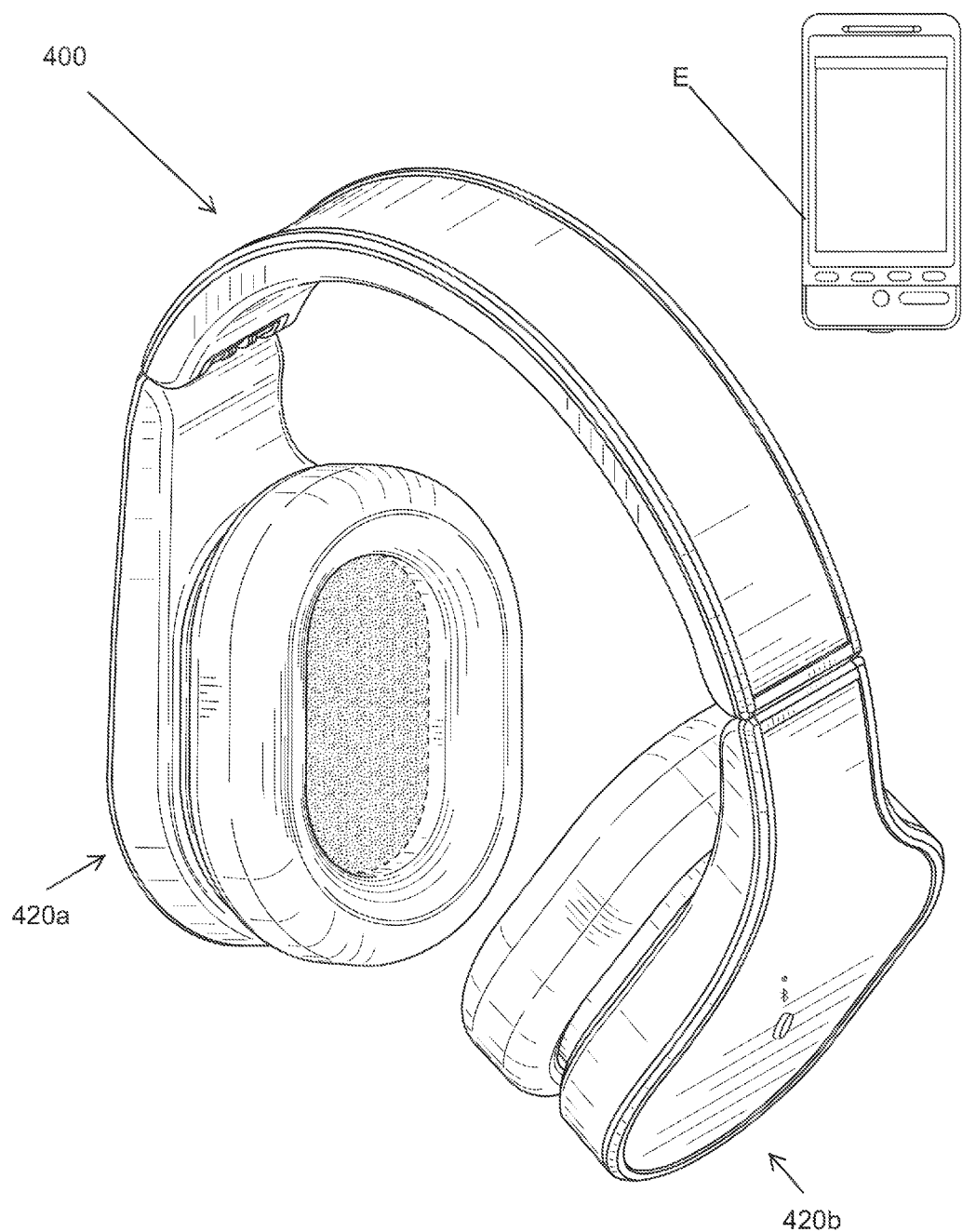
FIG. 6A is a perspective view of a pair of headphones and an associated external device according to an exemplary embodiment of the present invention.
Figure 6B:
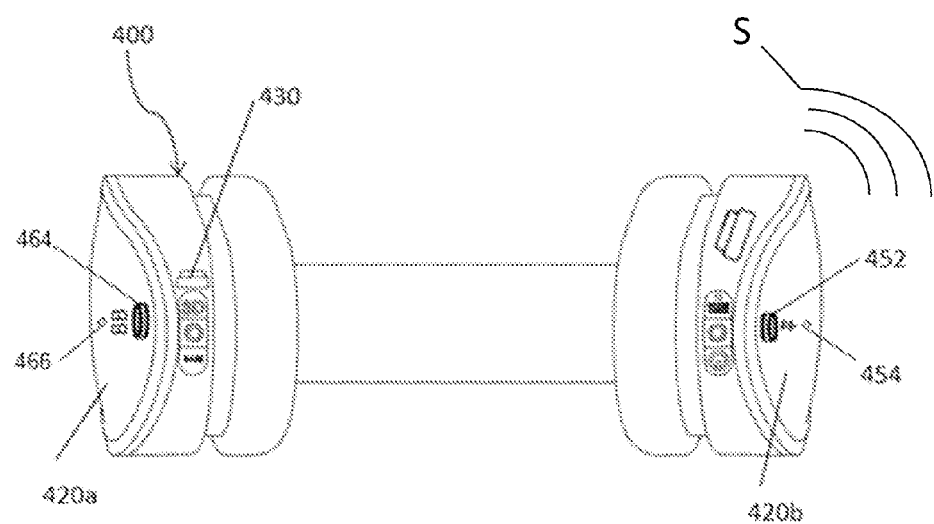
FIG. 6B is a bottom plan view of the headphones of FIG. 6A.

Turning to FIGS. 6A and 6B, a pair of headphones 400 may be provided that includes similar components to headphones 10, 100, 200, and/or 300 described above.

Accordingly, headphones 400 include a micro USB port 430 which can be used to charge an internal power source 440, such as a battery, in addition to transferring electrical signals, such as data signals, between headphones 400 and an external device E. In embodiments, internal power source 440 may be selectively electronically coupled or uncoupled from the remainder of electrically-powered components of headphones 400 described herein, e.g., through an electrical switch having an actuator such as a knob, button, dial, or toggle, to name a few. In embodiments, internal power source 440 may be selectively electronically coupled or uncoupled in this fashion through another type of actuator, such as a remote (e.g., infrared), radio signal (e.g., Bluetooth control), or voice- or motion-sensed activation.

In embodiments, internal power source 440 may be configured to enter a low power output mode, e.g., a standby mode or sleep mode, in which internal power source 440 outputs an amount of electrical energy sufficient for minimal functionality of electrically-powered components of headphones 400. In embodiments, a low power mode of internal power source 440 may be associated with, for example, a 0.2 mA electrical current output. In embodiments, a low power output mode associated with headphones 400 may be associated with a different electrical current output.

In embodiments, internal power source 440 may be lithium-ion (Li-ion) battery rated at 1200 mA-h. As described herein, internal power source 440 may be regulated such that a portion of the available electrical power available from internal power source 440 may be apportioned for different electrically-powered functions of headphones 400. In embodiments, internal power source 440 may have a different configuration, for example, a nickel-cadmium (NiCd) battery, a nickel-zinc (NiZn) battery, a nickel-metal hydride (Ni-MH) battery, a carbon-zinc battery, or an alkaline battery, to name a few, any of which may be rated at different electrical power outputs, for example, 800 mA-h, 900 mA-h, 1000 mA-h, 1100 mA-h, 1150 mA-h, 1200 mA-h, 1300 mA-h, or 1400 mA-h, to name a few.

In embodiments, headphones 400 may include one or more ports for data and/or charging operations, such a regular USB port 335 (FIG. 5) as described above, in any combination and/or arrangement. Such ports may be optionally provided on one or both of a pair of speakers 420a, 420b of headphones 400, or may be provided on other suitable locations of headphones 400. In embodiments, a dedicated port may be provided to receive analog audio signals from the connected external device E, or this functionality may be incorporated into another port, for example, micro USB port 430.

Still referring to FIGS. 6A and 6B, headphones 400 include one or more on-board electrically-powered components that can be supplied with electrical power from internal power source 440. As described herein, on-board electrically powered components of headphones 400 may be selectively activated (e.g., turned on and off by a user) or may be configured for continuous operation during use of headphones 400 or during a low power mode (e.g., a sleep mode or standby mode) of headphones 400.

In embodiments, headphones 400 may incorporate a wireless communication receiver 450. Wireless communication receiver 450 may be provided as an integrated wireless communication transceiver that includes a transmitter, receiver, and/or antenna into a single component. Wireless communication receiver 450 is configured to receive electromagnetic signals S that are transmitted wirelessly, for example, radio signals such as Bluetooth transmissions. In this regard, wireless communication receiver 450 may be electrically connected to one or both of speakers 420a and 420b of headphones 400 to convert a wirelessly received electromagnetic signal into audible sounds that can be enjoyed by a user. Such wirelessly received electromagnetic signals may be provided by a compatible wireless communication transmitter associated with external device E, or with another device within communications range of headphones 400.

Wireless receiver 450 may be selectively activated and/or deactivated by a user through a control 452 located on an external portion of headphones 400. Control 452 may be a knob, button, switch, toggle, or other type of actuator such as a remote (e g, infrared), radio signal (e.g., Bluetooth control), or voice- or motion-sensed actuator that is operable to activate and/or deactivate wireless receiver 450. In embodiments, wireless receiver 450 may be configured for continuous operation during use of headphones 400 or during a low power mode (e.g., a sleep mode or standby mode) of headphones 400.

In embodiments, an indicator 454, such as an LED or other source of illumination, may be provided on headphones 400 to indicate the active and/or inactive status of wireless receiver 450.

Headphones 400 may additionally or alternatively include a wide spectrum amplifier 460 that can modulate an input audio signal having a first voltage into an output audio signal having a second, higher voltage, e.g., wide spectrum amplifier 460 may cause a voltage amplitude associated with an audio signal to increase by a factor or gain. The resultant increase in voltage of the audio signal provided to one or both of speakers 420a, 420b of headphones 400 facilitated by wide spectrum amplifier 460 can produce an audible sound that is louder, for example, at an audible level consistent with a 10 dB gain applied to the sound produced by an electrical signal without the wide spectrum amplifier 460. In embodiments, wide spectrum amplifier 460 may act upon an electrical signal along a range of frequencies, for example, between 20 Hz and 20,000 Hz. In embodiments, wide spectrum amplifier 460 may act upon an electrical signal along a different range of frequencies.

Accordingly, wide spectrum amplifier 460 may include an electrically-powered component, such as a transistor, that receives electrical power from the internal power source 440 to modulate an audio signal. In embodiments, wide spectrum amplifier 460 may be configured to continuously draw electrical power from the internal power source 440 during operation of headphones 400, e.g., wide spectrum amplifier 460 may be configured for activation upon electrical connection of internal power source 440 to one or more electrical circuits along which the remaining electrically-powered components of headphones 400 are disposed. In embodiments, wide spectrum amplifier 460 may draw electrical current during a low power output mode of internal power source 440 as described above at a rate of, for example, 0.2 mA.

Figure 6C:
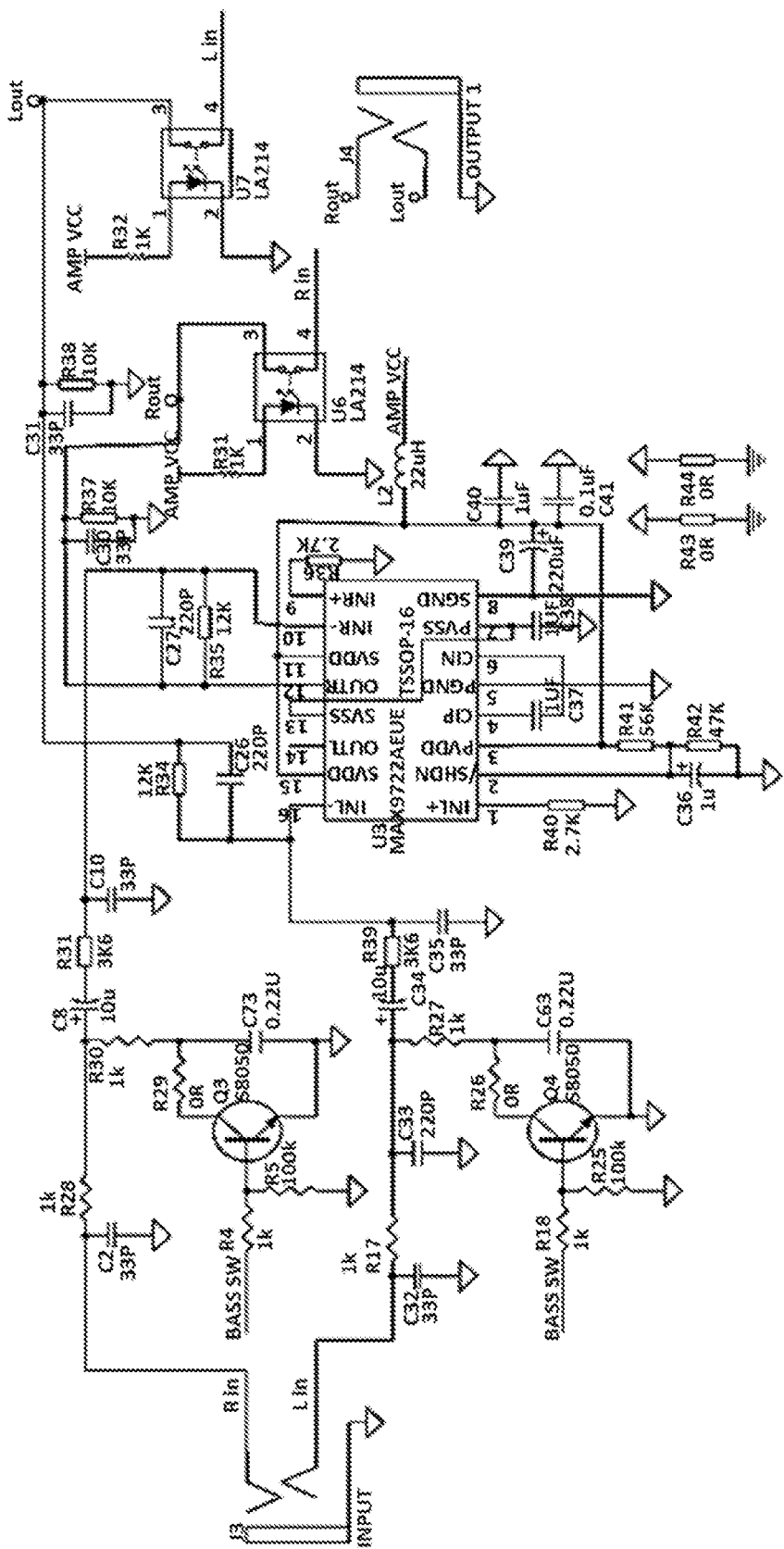
FIG. 6C is an electrical circuit diagram of a configuration of an amplifier of the headphones of FIG. 6A according to an exemplary embodiment of the present invention.
Figure 6D:
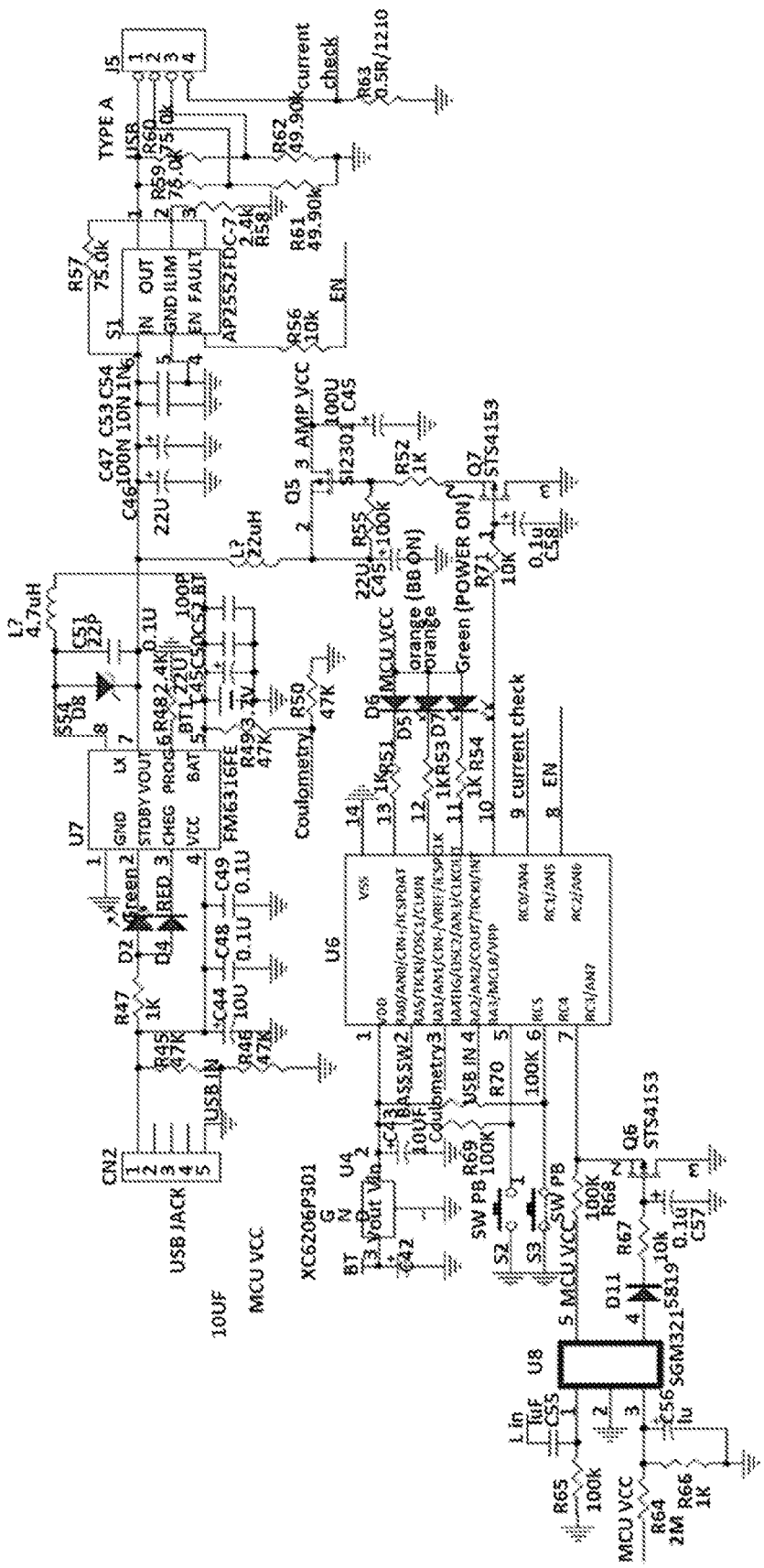
FIG. 6D is an electrical circuit of a configuration of another amplifier of the headphones of FIG. 6A according to an exemplary embodiment of the present invention.
Figure 6E:
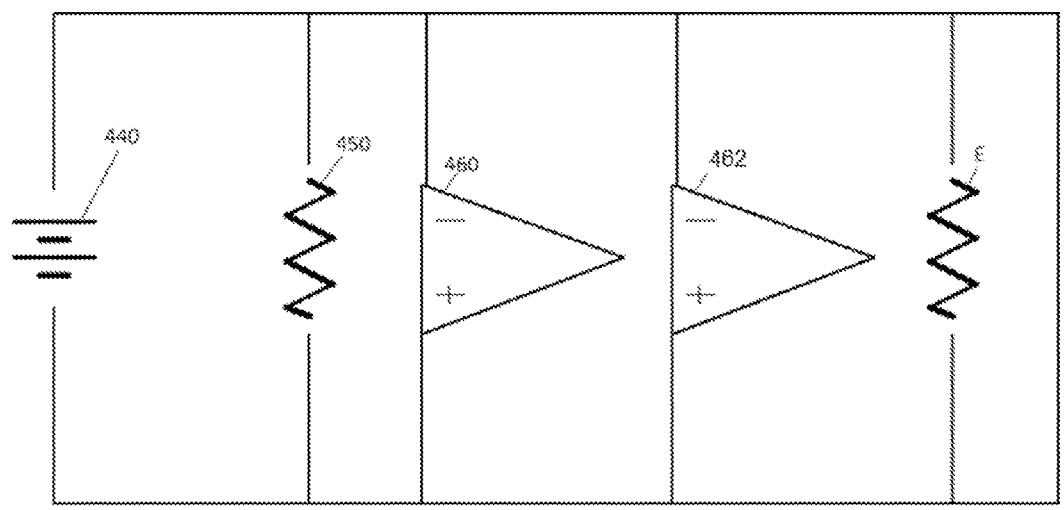
FIG. 6E is a schematic diagram of an electrical configuration of the pair of headphones of FIG. 6A according to an exemplary embodiment of the present invention.
Figure 6F:
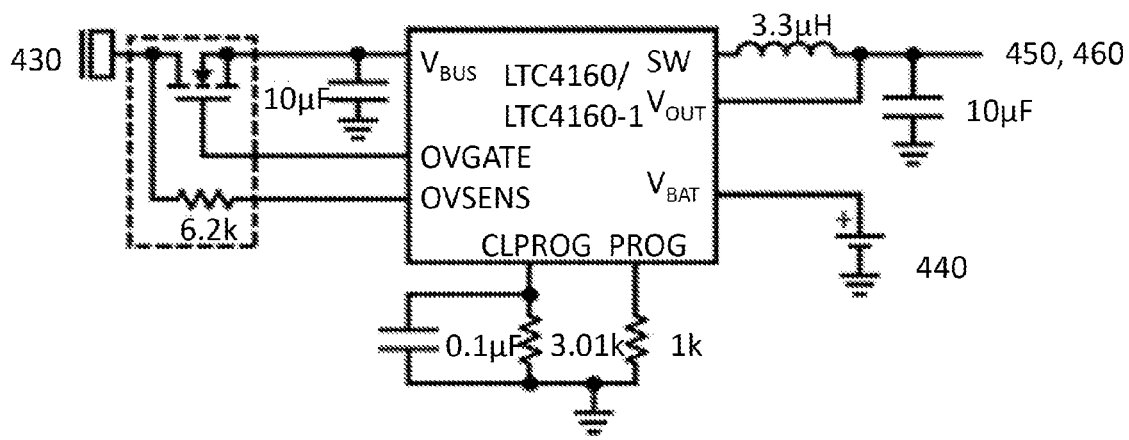
FIG. 6F is an electrical circuit diagram of a configuration of the pair of headphones of FIG. 6A including a power management component according to an exemplary embodiment of the present invention.

Referring additionally to FIG. 6C, one possible electrical configuration of headphones 400 including wide spectrum amplifier 460 is shown according to an exemplary embodiment of the present invention. In embodiments, headphones 400 and/or wide spectrum amplifier 460 may have a different electrical configuration.

What is claimed:

1. A headphone device, comprising:
a first speaker unit for providing audio output;
a second speaker unit for providing audio output and connected to the first speaker unit with a band;
an internal power source disposed in an interior portion of the headphone device;
one or more powered components electrically coupled with the internal power source to receive electrical power from the internal power source;
a port located on one of the first speaker unit and the second speaker unit, and in electrical communication with the internal power source; and
an internal power management component operatively connected between the internal power source and the port, the internal power management component configured to cause electrical power to flow from the internal power source through the port.

2. The headphone device of claim 1, wherein the one or more powered components comprise a wireless communication receiver.

3. The headphone device of claim 1, wherein the one or more powered components comprise an amplifier.

4. The headphone device of claim 1, wherein the internal power management component is configured to control an output voltage of the internal power source.

5. The headphone device of claim 1, wherein the port is configured to receive a first end of an electrical cable with a second end connectable to an external device.

6. The headphone device of claim 1, wherein the port is configured to receive a first end of an electrical cable with a second end connectable to a power adaptor for providing power from a wall outlet to charge the internal power source.

7. The headphone device of claim 1, wherein the internal power management component is configured to determine the amount of electrical power in the internal power source and prevents the transfer of electrical power from the internal power source if the amount of electrical power is less than or equal to a predefined threshold electrical power level.

8. The headphone device of claim 1, wherein the internal power source comprises one or more rechargeable batteries.

9. The headphone device of claim 1, wherein the internal power source comprises one or more disposable batteries.

10. The headphone device of claim 1, wherein the power management component comprises a power manager integrated circuit.

11. The headphone device of claim 1, wherein the port is a USB-type port for receiving a USB-type cable.

12. The headphone device of claim 11, wherein the USB type port is a micro USB port and the USB-type cable has at least one micro USB-type connector.

13. The headphone device of claim 1, wherein the one or more powered components comprise a wireless communication transmitter.

14. The headphone device of claim 1, wherein the one or more powered components comprise a wireless communication transceiver.

15. The headphone device of claim 1, wherein the one or more powered components comprise an amplifier.

16. The headphone device of claim 15, wherein the amplifier continuously receives electrical power from the internal power source.

17. The headphone device of claim 15, wherein the amplifier is configured to apply a voltage gain to an input electrical signal along a frequency range of 20 Hz to 20,000 Hz.

18. The headphone device of claim 15, wherein the amplifier is configured to apply a voltage gain along a frequency range of 20 Hz to 500 Hz.

* * * * *